(12) United States Patent
Hanjani et al.

(10) Patent No.: US 6,373,256 B1
(45) Date of Patent: Apr. 16, 2002

(54) PROGRAMMABLE LOW BATTERY DETECTOR

(75) Inventors: Hassan M. Hanjani, Fremont; Hungyu Howard Hou, Sunnyvale, both of CA (US); Charles Watts, Jr., Crowley, TX (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/233,723

(22) Filed: Jan. 8, 1999

(51) Int. Cl.$^7$ ............................................. G01N 27/416
(52) U.S. Cl. ...................................... 324/433; 324/426
(58) Field of Search ................................. 324/433, 429, 324/427; 320/13, 48, 132

(56) References Cited

U.S. PATENT DOCUMENTS

| | | | | |
|---|---|---|---|---|
| 4,020,414 A | * | 4/1977 | Paredes ........................ 324/433 |
| 4,071,884 A | * | 1/1978 | Maigret ........................ 363/21 |
| 4,397,564 A | * | 8/1983 | Kawahara ..................... 368/204 |
| 4,544,893 A | | 10/1985 | Takahashi .................... 324/433 |
| 4,665,370 A | * | 5/1987 | Holland ....................... 324/429 |
| 4,868,908 A | | 9/1989 | Pless et al. ................. 323/267 |
| 5,045,717 A | * | 9/1991 | Moen et al. ............. 307/296.3 |
| 5,122,751 A | | 6/1992 | Aita et al. ................... 324/429 |
| 5,284,719 A | | 2/1994 | Landau et al. ................. 429/50 |
| 5,339,017 A | | 8/1994 | Yang ............................. 320/13 |
| 5,438,270 A | * | 8/1995 | Harper et al. ................ 324/429 |
| 5,504,416 A | * | 4/1996 | Holloway et al. ............. 320/31 |
| 5,550,475 A | * | 8/1996 | Shafer ......................... 324/433 |
| 5,640,626 A | | 6/1997 | Makiyama et al. ......... 396/287 |
| 5,744,984 A | * | 4/1998 | Drapac et al. ................ 327/89 |
| 5,789,923 A | | 8/1998 | Shimoyama et al. ....... 324/427 |
| 5,814,995 A | * | 9/1998 | Tasdighi ...................... 324/431 |

OTHER PUBLICATIONS

1980 Linear Data Book National Semiconductor. ADC0800 (MM4357B/MM535).*
"Analysis and Design of Analog Integrated Circuits" by Paul R. Gray and Robert G. Meyer, third edition, 1993 by John Wiley and Sons, pp. 338–346 No month available.

* cited by examiner

*Primary Examiner*—Safet Metjahic
*Assistant Examiner*—Vincent Q. Nguyen
(74) *Attorney, Agent, or Firm*—Townsend and Townsend and Crew LLP

(57) ABSTRACT

A low battery detect circuit with digitally programmable detect levels. The programmable low battery detect circuit includes a comparator that compares a stable reference voltage against a battery-supplied voltage as divided down by a digitally programmable resistive divider chain. By programmably varying the resistance of the divider chain, the low battery detect threshold level can be varied depending on the requirements of the application.

17 Claims, 3 Drawing Sheets

PROGRAMMABLE LOW BATTERY DETECTOR

BACKGROUND OF THE INVENTION

The present invention relates in general to integrated circuits and in particular to programmable low battery detect circuitry.

Many of today's battery operated consumer electronic devices provide internal circuitry for detecting the reduction of the battery charge below a certain threshold. The low battery detect circuit is commonly set to trigger some type of user alert mechanism once the battery charge drops below the threshold level. A typical low battery detect circuit uses an internal reference voltage that is set to the desired threshold level. The battery voltage level is continually compared against the reference voltage level, with the output of the compare circuitry signaling the state of the battery.

The threshold level at which a low battery is detected depends on the type of battery used, the voltage level it operates at, and the application circuitry it powers. Even within the same general field of application, however, what constitutes low battery varies from one specific application to another. A low battery detect circuit that is designed with a single fixed threshold voltage must therefore be redesigned for the same application if, for example, the next generation devices operate at lower power supply voltage levels. A fixed low battery threshold level has similar drawbacks in case of general purpose microcontrollers that may be used in different applications. Because in certain applications it is common for a device to operate with either one battery at a first voltage level, or two batteries at twice the first voltage level, certain types of microcontrollers may provide for two different low battery threshold levels. However, the application range for even these types of microcontrollers remains limited.

There is a need for programmable low battery detect circuits that provide a low battery threshold level that can be programmably adjusted within a range of voltage levels.

SUMMARY OF THE INVENTION

The present invention provides low battery detect circuitry having user programmable low battery threshold level. Broadly, the present invention utilizes a comparator that compares a stable reference voltage against a battery-supplied power source voltage as divided down by a digitally programmable resistive divider chain. In a preferred embodiment, the resistive divider chain is made up of multiple identical resistive elements that are programmed in or out of the resistive chain by a corresponding multiple of field effect transistors (FETs). By allowing the user to digitally adjust the resistive divider ratio by fine increments, the low battery level can be programmed to any level between a given range.

Accordingly, in one embodiment, the present invention provides a low battery detect circuit including a comparator coupled between a power supply node and ground, and having a first input, a second input, and an output, a reference voltage generating circuit having an output coupled to the first input of the comparator, a programmable resistive divider circuit coupled to the second input of the comparator, wherein the programmable resistive divider circuit includes a plurality of resistors coupled between the power supply node and ground, a plurality of transistors coupled to a subset of the plurality of resistors, and control logic having a plurality of outputs respectively coupled to the plurality of transistors.

In a preferred embodiment, the reference voltage generating circuit is a band-gap reference circuit, the plurality of resistors are identical in value, and the plurality of transistors are of field effect type. The low battery detect circuit further includes storage circuitry coupled to inputs of the control logic for storing programming information.

A better understanding of the nature and advantages of the programmable low battery detect circuit of the present invention may be gained with reference to the detailed description and the drawings below.

DESCRIPTION OF THE SPECIFIC EMBODIMENTS

Figure 1:
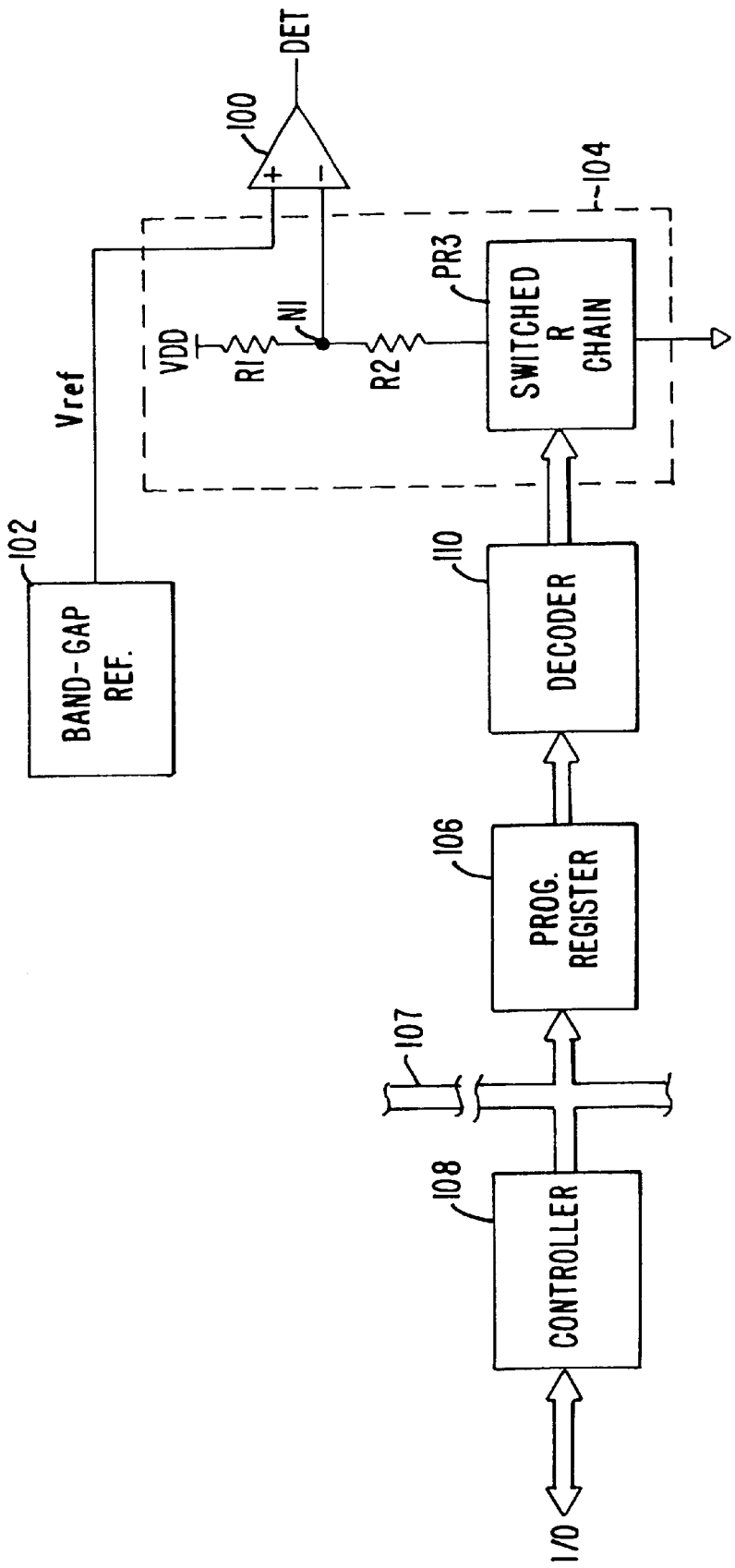
FIG. 1 is a simplified block diagram of the programmable low battery detect circuit according to one embodiment of the present invention.

Referring to FIG. 1, there is shown a block diagram of the programmable low battery detect circuit according to the present invention. The circuit includes a comparator 100 that receives, at one input, a reference signal Vref generated preferably by a band-gap circuit 102. The other input of comparator 100 connects to a chain of resistors 104 that connects between the power supply VDD and ground. The power at VDD is supplied by the battery whose charge level is to be detected. Chain of resistors 104 includes fixed resistors R1 and R2, and a digitally programmable switched resistor circuit PPR3. Digitally programmable switched resistor circuit PR3 is made up of multiple resistors and switches described in greater detail in connection with FIGS. 2 and 3. A programmable register 106 receives, via a bus 107, programming data from a controller 108. The programming data is then decoded by a decoder 110 that drives the switches in switched resistor circuit PPR3.

In operation, the manufacturer is able to load a selected value in programming register 106 via controller 108. The programming value reflects the requirements of the end user application. By varying the programming data, the value of the resistance presented by programmable resistor circuit PR3 changes. This in turn, varies the resistive divider ratio that generates the compare voltage at node N1. As the battery charge decreases, the voltage level at VDD reduces, lowering the voltage level at node N1. Once the voltage level at node N1 drops below Vref, the output DET of comparator 100 is asserted signaling a "low battery" condition. Thus, the battery level at which DET is asserted can be programmably varied. In one embodiment, given the specific application requirement, once the voltage at node N1 is adjusted to the desired level by appropriate programming data, the programming data may be stored permanently in a non-volatile memory (not shown). This allows controller 108 to read the low battery level program value from the non-volatile memory, and load register 106 with the programming data, every time the device in which the circuit is employed powers up. An example of a general purpose microcontroller that is equipped with the various types of memory suitable for such applications can be found in the "Arithmetic Controller Engine (ACE) for Low Power Secure Applications" (FM98ACE01/02) manufactured by Fairchild Semiconductor.

Figure 2:
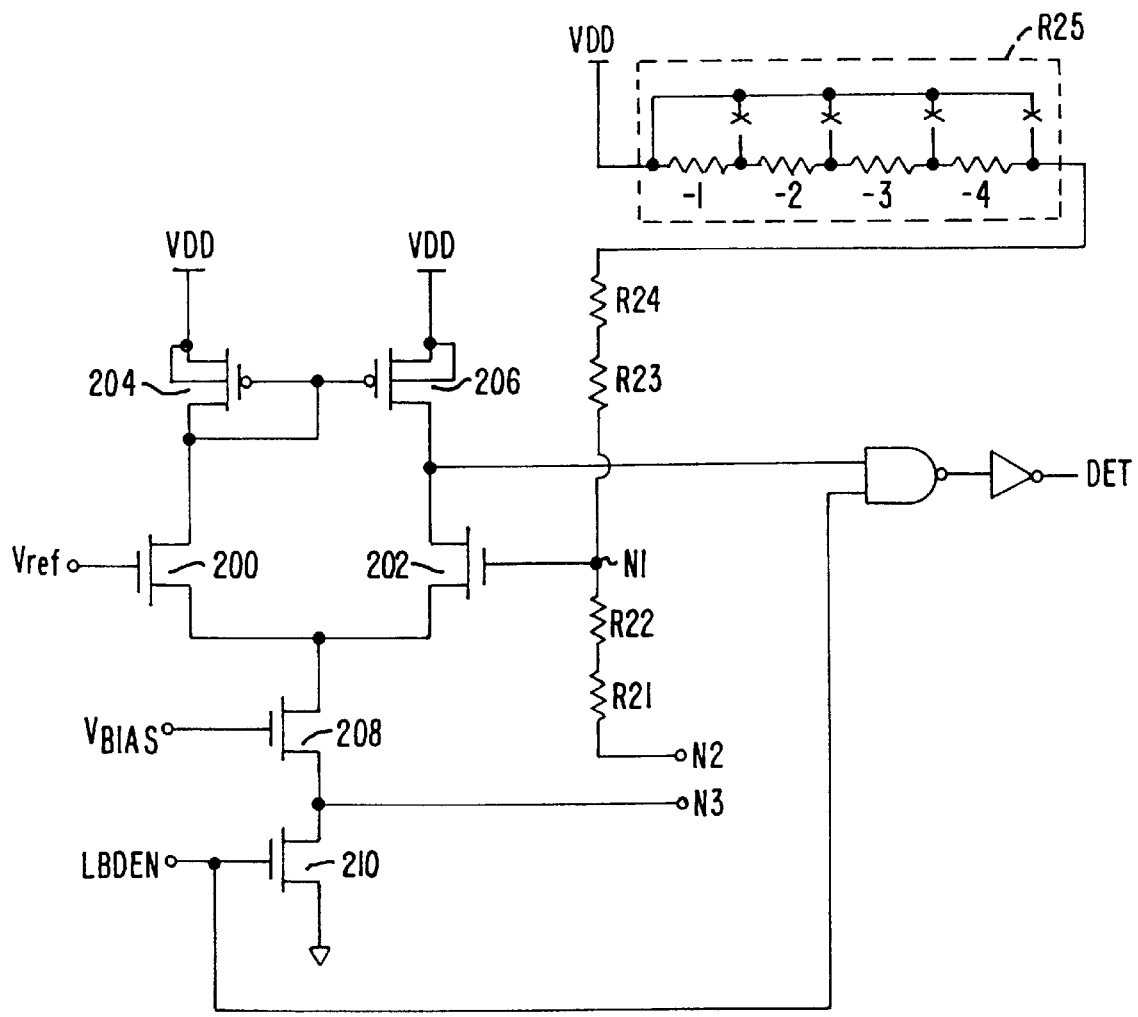
FIG. 2 is an exemplary circuit implementation of the programmable low battery detect of present invention showing the comparator.

Programmable resistor circuit PR3 can be designed to provide a low battery detect level ranging from, e.g., 3.1 volts, to 2.4 volts with 0.1 increments, in the case of, e.g., a 5 volt battery. This example would require a three bit programmable register 106 to generate the eight 0.1 volt increments. A specific embodiment implementing such a circuit will be described hereinafter in connection with FIGS. 2 and 3. FIG. 2 shows an exemplary circuit implementation of part of the low battery detect circuit of the present invention including comparator 100. Comparator 100 is made up of n-channel input transistors 200 and 202, p-channel load transistors 204 and 206, n-channel current-source transistor 208, and n-channel enable transistor 210 connected between the power supply VDD and ground as shown. The positive input of comparator 100 at the gate of transistor 200 connects to Vref, and the negative input at the gate of transistor 202 connects to node N1. Current-source transistor 208 receives a bias voltage Vbias from a reference voltage generator that could be bandgap circuit 102. Enable transistor 210 receives a low battery detect enable signal LBDEN (from controller 108). When a logic low signal is applied to LBDEN (by controller 108), transistor 210 is turned off disconnecting comparator 100 from ground. This effectively disables the comparator and the low battery detect circuitry. This feature is optional, and may be provided in applications that require functions such as power down, or sleep mode. When not required, transistor 210 would be removed with the source terminal of transistor 208 connecting directly to ground.

In the circuit example shown in FIG. 2, the resistor divider chain is made up of a number of preferably identical resistor elements including fixed resistors R23=R24=R25=R that connect in series between node N1 and power supply VDD, and fixed resistors R22=R21=R that connect in series between node N1 and node N2. In this example, resistor R25 is shown as having multiple segments (R24-1, R25-2, R25-4, and R25-4) for trimming purposes. This is optional and will be described further below. The digitally programmable portion of the resistor divider chain is provided between nodes N2 and N3, an example of which is shown in FIG. 3.

Figure 3:
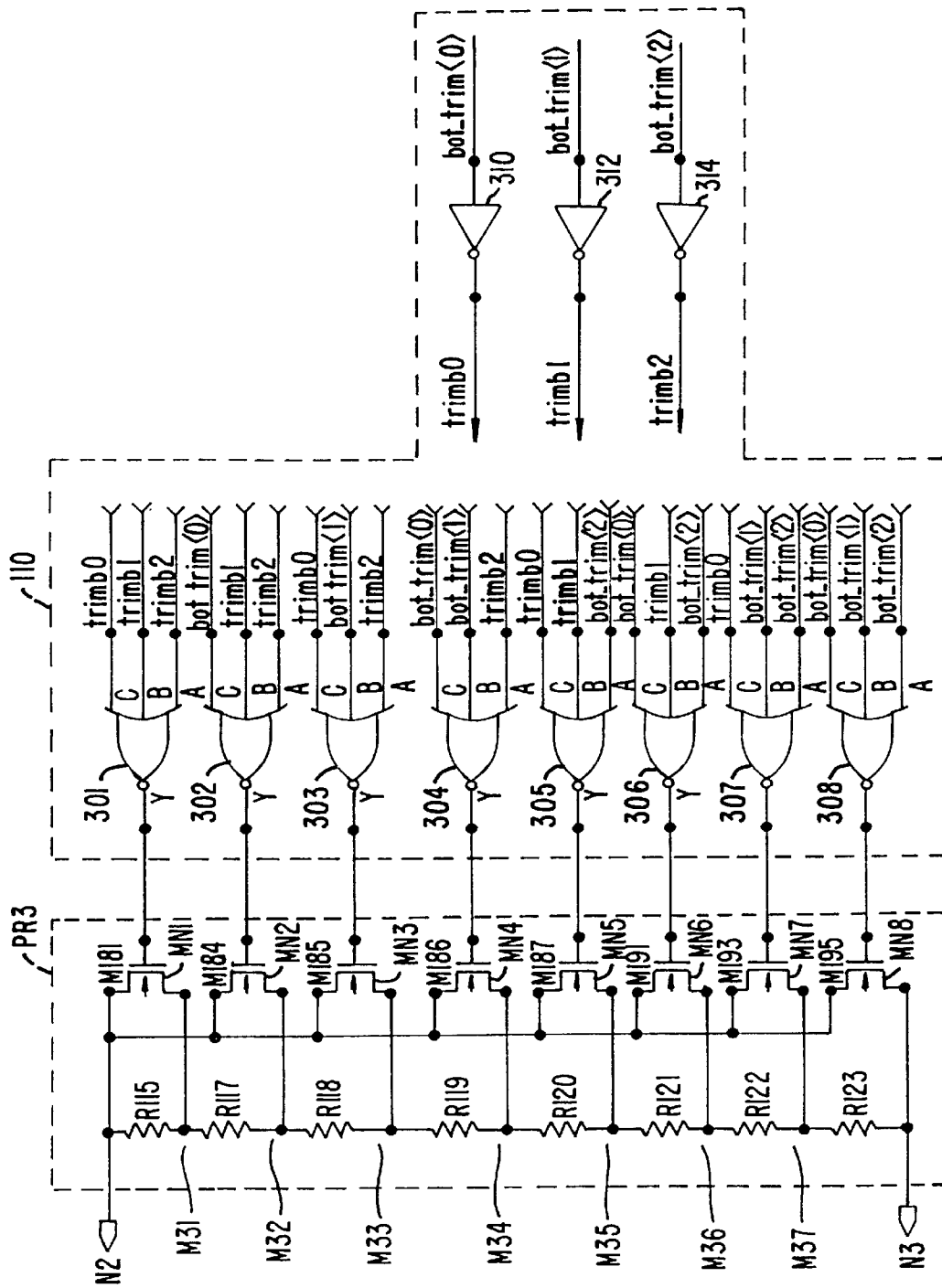
FIG. 3 shows an exemplary implementation for the digitally programmable variable resistor divider chain used in the battery detect circuit of the present invention.

Referring now to FIG. 3, there is shown an exemplary embodiment of the digitally programmable switched resistor circuit PR3 and decoder 110 (FIG. 1). Switched resistor circuit PR3 includes eight identical resistors R31 to R38 connected in series, the total resistance value of which is preferably equal to those of R21=R22=R23=R24=R25=R. The circuit further includes eight n-channel switch transistors MN1 to MN8, the drain terminal of all of which connects to node N2, while the source terminal of each connects respectively to one of the resistor taps, nodes N31, N32, N33, N34, N35, N36, N37, and N3. That is, first n-channel transistor MN1 connects between nodes N2 and N31, second n-channel transistor MN2 connects between nodes N2 and N32, third n-channel transistor MN3 connects between nodes N2 and N33, and so on, until eighth transistor MN8 that connect between nodes N2 and N3. The gate terminals of transistors MN1 to MN8 are driven by the outputs of decoder 110. Decoder 110 includes eight three-input NOR gates 301 to 308, the outputs of which respectively drive the gate terminals of the eight switch transistors in circuit P3. The input terminals of the NOR gates receive the low battery detect program data made up of three battery trim bits bat_trim<2:0> and their inverse (trimb<2:0>) generated by three inverters 310, 312, and 314. When any one of transistors MN1 to MN8 is turned on, the conducting channel of that transistor shorts node N2 to the resistor tap connected to its source, thereby reducing the resistance value of PR3. Given identical resistor segments R31 to R38, the resistance value of PR3 can thus be varied by equal increments.

In operation, comparator 100 has its positive input connected to the output of a band-gap reference circuit. The voltage at Vref is thus set to, e.g., 1.25 volts and remains stable at that voltage regardless of variations in VDD (i.e., the battery voltage level,) which way vary from e.g., 1.8 volts to 6.6 volts in a 5 volt battery application. The voltage at the other input of comparator 100, node N1, is determined by the programmed value of PR3 and the battery level VDD:

$$V(N1) =$$
$$(VDD) \times \left(\frac{R22 + R21 + PR3}{R25 + R24 + R23 + R22 + R21 + PR3}\right) = (VDD) \times \left(\frac{2R + PR3}{5R + PR3}\right)$$

If PR3 is programmed to its full value (i.e., all switches are turned off), the above equation is reduced to V(N1)= (VDD)×(3R/6R), or ½ VDD. Given an exemplary nominal battery level VDD of 5 volts, this setting will ensure that when VDD drops below 2.5 volts (i.e., when the voltage at node N1 drops below 1.25 volts or Vref), the output of comparator 100 toggles, asserting DET to signal a low battery condition. If, however, a particular application requires detection of low battery at a lower VDD level, PR3 can be programmed to turn on the appropriate switch transistor to reduce its resistance.

The purpose of segmenting resistor R25 is to provide the option of shifting the programmable low battery detect range up towards VDD. This is accomplished by shorting one or more segments of R25 to reduce its total resistance value. Since the purpose of varying R25 is to set the programmable range, it need not be digitally programmable itself. Thus, once the circuit is fabricated on silicon, the range can be shifted by mask trimming the value of R25. Similar segmentation may be done for other resistors R24 and R23. For illustrative purposes only, the resistance R can be set to, for example, 33 K Ohms, with the eight resistor segments R31 to R38 each having a value of 4.5 K Ohms. Trimming R25 to shift the start of the programmable range to, e.g., 3.1 volts, yields a low battery detect circuit that can be programmed to detect a low battery condition anywhere in the range of 3.1 volts to 2.4 volts, programmable at 0.1 volt decrements. In a preferred embodiment, transistors MN1 to MN8 are designed to have minimum on-resistance, and laid out to minimize any parasitic resistance that might be added by their source/drain connections to the resistor taps.

In conclusion, the present invention provides a digitally programmable low battery detect circuit. While the above is a complete description of the preferred embodiment of the present invention, it is possible to use various alternatives, modifications and equivalents. For example, a programmable low battery detect circuit operating in accordance with the principles of the present invention can be designed with the polarity of the field effect transistors changed from n-channel to p-channel. Also, other circuit elements with well defined resistive properties (e.g., field effect transistors) may be used to implement the resistive divider chain. The number of fixed resistors in the resistor divider chain may vary depending upon the implementation without departing from the scope of the invention. Therefore, the scope of the present invention should be determined not with reference to the above description but should, instead, be determined with reference to the appended claims, along with their full scope of equivalents.

What is claimed is:

1. A programmable low battery detect circuit, comprising:
   a comparator receiving voltage supplied by a battery having first and second terminals, and having a first input, a second input, and an output;
   a reference voltage generating circuit configured to generate a stable voltage and having an output coupled to the first input of the comparator; and
   a resistive voltage divider chain coupled between the first and second terminals of the battery, and coupled to the second input of the comparator,
   wherein, the resistive voltage divider chain includes a fixed resistive element and a programmable resistive element, and wherein, the programmable resistive element comprises:
      a plurality of resistive segments,
      a plurality of transistors coupled to the plurality of resistive segments, and
      digitally programmable control logic having a plurality of outputs respectively coupled to the plurality of transistors.

2. The programmable low battery detect circuit of claim 1 wherein the fixed resistive element couples between the second input of the comparator and the first terminal of the battery, and wherein the programmable resistive element couples between the second input of the comparator and the second terminal of the battery.

3. The programmable low battery detect circuit of claim 2 wherein the plurality of transistors in the programmable resistive divider are serially connected between a first node and a second node, with a plurality of taps therebetween.

4. The programmable low battery detect circuit of claim 3 wherein the plurality of transistors are of the field effect transistor (FET) type each having a first source/drain terminal coupled to the first node, and a second source/drain terminal respectively coupled to one of the plurality of taps.

5. The programmable low battery detect circuit of claim 4 wherein the digitally programmable control logic comprises a decoder that receives programming data at its input terminals and generates control signals at its plurality of outputs.

6. The programmable low battery detect circuit of claim 5 wherein the reference voltage generating circuit is a band-gap circuit coupled between the first and second terminals of the battery.

7. The programmable battery detect circuit of claim 6 wherein the resistive divider chain comprises a first plurality of serially-connected fixed resistive elements coupled between the first terminal of the battery and the second input of the comparator, and a second plurality of fixed resistive elements coupled between the second input of the comparator and the first node.

8. The programmable battery detect circuit of claim 7 wherein a value of resistance of each one of the first plurality of serially-connected fixed resistive elements, and each one of the second plurality of fixed resistive elements is substantially equal to a total value of resistance of the plurality of resistive segments in the programmable resistive element.

9. The programmable battery detect circuit of claim 8 wherein the programmable resistive element comprises eight resistive segments coupled to eight transistors, and wherein the decoder receives a three-bit programming data to generate eight binary control signals driving gate terminals of the eight transistors.

10. The programmable battery detect circuit of claim 8 further comprising an enabling transistor having a first current carrying terminal coupled to the second node and to a node of the comparator, a second current carrying terminal coupled to the second terminal of the battery, and a third terminal operative to receive a signal which either enables or disables the enabling transistor.

11. A programmable low battery detect circuit, comprising:
   a comparator receiving voltage supplied by a battery having first and second terminals, and having a first input, a second input, and an output;
   a reference voltage generating circuit configured to generate a stable voltage and having an output coupled to the first input of the comparator; and
   a resistive voltage divider chain coupled between the first and second terminals of the battery, and coupled to the second input of the comparator,
   wherein, the resistive voltage divider chain includes a fixed resistive element and a programmable resistive element, and wherein, the programmable resistive element comprises:
      a plurality of resistive segments,
      a plurality of transistors coupled to the plurality of resistive segments, and
      digitally programmable control logic having a plurality of outputs respectively coupled to the plurality of transistors, wherein the fixed resistive element couples between the second input of the comparator and the first terminal of the battery, and wherein the programmable resistive element couples between the second input of the comparator and the second terminal of the battery, wherein the plurality of transistors in the programmable resistive divider are serially connected between a first node and a second node, with a plurality of taps therebetween, wherein the plurality of transistors are of the field effect transistor (FET) type each having a first source/drain terminal coupled to the first node, and a second source/drain terminal respectively coupled to one of the plurality of taps, wherein the digitally programmable control logic comprises a decoder that receives programming data at its input terminals and generates control signals at its plurality of outputs, wherein the programmable battery detect circuit further comprises a storage circuit configured to receive and store the programming data, output of the storage circuit being coupled to the decoder.

12. The programmable battery detect circuit of 11 further comprising a controller coupled to the storage circuit, the controller having input/output terminals configured to interface with external circuitry.

13. The programmable battery detect circuit of 12 wherein programming data is loaded into the storage circuit by the controller to selectively switch the state of the plurality of transistors to obtain a desired resistance value of the programmable resistive element, thereby adjusting a voltage level at the second input of the comparator and a level at which low battery is detected.

14. A programmable low battery detect circuit, comprising:
   a comparator receiving voltage supplied by a battery having first and second terminals, and having a first input, a second input, and an output;
   a reference voltage generating circuit configured to generate a stable voltage and having an output coupled to the first input of the comparator; and
   a resistive voltage divider chain coupled between the first and second terminals of the battery, and coupled to the second input of the comparator, wherein, the resistive voltage divider chain includes a fixed resistive element and a programmable resistive element, and wherein, the programmable resistive element comprises:
a plurality of resistive segments,
a plurality of transistors coupled to the plurality of resistive segments, and
digitally programmable control logic having a plurality of outputs respectively coupled to the plurality of transistors, wherein the fixed resistive element couples between the second input of the comparator and the first terminal of the battery, and wherein the programmable resistive element couples between the second input of the comparator and the second terminal of the battery, wherein the plurality of transistors in the programmable resistive divider are serially connected between a first node and a second node, with a plurality of taps therebetween, wherein the plurality of transistors are of the field effect transistor (FET) type each having a first source/drain terminal coupled to the first node, and a second source/drain terminal respectively coupled to one of the plurality of taps, wherein the digitally programmable control logic comprises a decoder that receives programming data at its input terminals and generates control signals at its plurality of outputs, wherein the reference voltage generating circuit is a band-gap circuit coupled between the first and second terminals of the battery, wherein the resistive divider chain comprises a first plurality of serially-connected fixed resistive elements coupled between the first terminal of the battery and the second input of the comparator, and a second plurality of fixed resistive elements coupled between the second input of the comparator and the first node, wherein at least one of the first plurality of fixed resistive elements is configured into a plurality of mask programmable resistive segments.

15. A method for detecting a low battery condition for a battery, the method comprising the steps of:
supplying the battery voltage to a programmable resistive divider chain;
measuring the battery voltage level on an internal node of the programmable resistive divider chain, where the internal node carries a divided-down value of the battery voltage level;
adjusting the divided-down value of the battery voltage level by programmably varying resistance values in the resistive divider chain; and
comparing the adjusted divided-down value of the battery voltage level to a stable reference voltage.

16. The method of claim 15 wherein the step of adjusting further comprises the steps of:
applying resistor programming data to a programmable register;
decoding the resistor programming data; and
applying decoded resistor programming data to the programmable resistive divider chain.

17. A programmable low battery detect circuit, comprising:
a comparator coupled between ground and a source of power supplied by a battery, and having a first input, a second input and an output;
a band-gap reference circuit coupled between the source of power and ground, and having an output coupled to the first input of the comparator;
a resistor voltage divider chain comprising:
a fixed resistor coupled between the source of power and the second input of the comparator, and
a programmable resistor circuit coupled between the second input of the comparator and ground, the programmable resistor circuit including a plurality of serially-connected resistor segments coupled to a plurality of transistors,
a decoder having a plurality of inputs and a plurality of outputs, the plurality of outputs of the decoder being coupled to the plurality of transistors in the programmable resistor circuit;
a register having a plurality of inputs, the register having storage elements configured to store programming data receive on its plurality of inputs;
a controller having input/output terminals to interface with external circuitry; and
a bus coupling the controller to the register,
wherein, the controller supplies programming data to the storage element, in response to which the decoder generates control signals that control the state of the plurality of transistors in the programmable resistor circuit.

* * * * *